(12) United States Patent
Imai et al.

(10) Patent No.: US 7,981,761 B2
(45) Date of Patent: Jul. 19, 2011

(54) METHOD OF MANUFACTURING SEMICONDUCTOR DEVICE HAVING MIM CAPACITOR

(75) Inventors: Toshinori Imai, Ome (JP); Tsuyoshi Fujiwara, Hamura (JP); Hiroshi Ashihara, Hachioji (JP); Akira Ootaguro, Ome (JP); Yoshihiro Kawasaki, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/750,402

(22) Filed: Mar. 30, 2010

(65) Prior Publication Data

US 2010/0181647 A1    Jul. 22, 2010

Related U.S. Application Data

(62) Division of application No. 12/024,140, filed on Feb. 1, 2008, now abandoned.

(30) Foreign Application Priority Data

Feb. 27, 2007   (JP) .................................. 2007-046387

(51) Int. Cl.
| | |
|---|---|
| *H01L 21/20* | (2006.01) |
| *H01L 21/8242* | (2006.01) |
| *H01L 21/4763* | (2006.01) |
| *H01L 21/70* | (2006.01) |
| *H01L 21/02* | (2006.01) |
| *H01L 23/48* | (2006.01) |
| *H01L 23/52* | (2006.01) |
| *H01L 23/28* | (2006.01) |

(52) U.S. Cl. ........ 438/393; 438/239; 438/250; 438/622; 257/508; 257/532; 257/758

(58) Field of Classification Search .................. 438/250, 438/393

See application file for complete search history.

(56) References Cited

U.S. PATENT DOCUMENTS

| | | | |
|---|---|---|---|
| 2001/0045651 A1 | 11/2001 | Saito et al. | |
| 2006/0154433 A1 | 7/2006 | Onoda | |
| 2006/0289917 A1* | 12/2006 | Fujiwara et al. | 257/296 |
| 2008/0020540 A1* | 1/2008 | Takeda et al. | 438/393 |

FOREIGN PATENT DOCUMENTS

| | | |
|---|---|---|
| JP | 2002-043517 | 2/2002 |
| JP | 2002-329790 | 11/2002 |
| JP | 2005-311299 | 11/2005 |

* cited by examiner

*Primary Examiner* — N Drew Richards
*Assistant Examiner* — Michael Jung
(74) *Attorney, Agent, or Firm* — Antonelli, Terry, Stout & Kraus, LLP.

(57) ABSTRACT

In this invention, the film thicknesses of an upper barrier film of a lower electrode of a capacitive element and an upper barrier film of a metallic interconnect layer formed in the same layer as this is made thicker than the film thicknesses of upper barrier films of other metallic interconnect layers. Moreover, in this invention, the film thickness of the upper barrier film of the lower electrode of the capacitive element is controlled to be 110 nm or more, more preferably, 160 nm or more. A decrease in the dielectric voltage of the capacitive dielectric film due to cracks in the upper barrier film does not occur and the deposition temperature of the capacitive dielectric film can be made higher, so that a semiconductor device having a MIM capacitor with high performance and high capacitance can be achieved, where the dielectric voltage of the capacitive dielectric film is improved.

5 Claims, 6 Drawing Sheets

METHOD OF MANUFACTURING SEMICONDUCTOR DEVICE HAVING MIM CAPACITOR

CROSS-REFERENCE TO RELATED APPLICATIONS

The present application is a divisional application of U.S. application Ser. No. 12/024,140 filed, Feb. 1, 2008, now abandoned and which application claims priority from Japanese application JP 2007-046387 filed on Feb. 27, 2007, the content of which is hereby incorporated by reference into this application.

FIELD OF THE INVENTION

The present invention relates to a semiconductor device which includes a capacitive element with high reliability and high performance and a manufacturing method thereof.

BACKGROUND OF THE INVENTION

In an RF analog IC, composing a circuit which includes a high performance capacitive element, a resistive element, and an inductor element becomes an important factor. Specifically, a decrease in the parasitic resistance and parasitic capacitance has been required due to the need for high-speed performance, low power consumption, and space-saving of a system.

In such a situation, attention has been paid recently to a MIM (Metal-Insulator-Metal) capacitor as a capacitive element which enables a reduction in the parasitic resistance and parasitic capacitance.

As disclosed in JP-A No. 2002-329790 and JP-A No. 2005-311299, in a MIM capacitor, a film made of the same material as the aluminum interconnect is used for a lower electrode of the capacitive element in order to decrease the parasitic resistance. The aluminum interconnect generally has a film structure where the upper face of a film including aluminum as a main component is covered with a barrier film, and a MIM capacitor in JP-A No. 2002-329790 has a lower electrode where the upper face of an aluminum film is covered with a thin barrier film (55 to 85 nm) consisting of a stacked film of a titanium film and a titanium nitride film. Moreover, a MIM capacitor in JP-A No. 2005-311299 has a lower electrode where the upper face of an aluminum film is covered with a thin barrier film (50 nm) consisting of a titanium nitride film.

Furthermore, in a MIM capacitor, the capacitive dielectric film has been made thinner in order to increase capacitance, and improvement of the reliability of the dielectric voltage of the capacitive dielectric film which is made thinner also becomes an important problem. JP-A No. 2002-43517 was proposed as a technology to solve such a problem.

In JP-A No. 2002-43517, after the roughness of the surface of the lower electrode is planarized by performing ion irradiation or plasma irradiation on the surface of the lower electrode, a capacitive dielectric film is deposited. Therefore, it is described that making the film thickness of the capacitive dielectric film can be compatible with improvement of the dielectric voltage thereof.

SUMMARY OF THE INVENTION

When the lower electrode of the MIM capacitor is formed of a film made of the same material as the aluminum interconnect, as described in JP-A No. 2002-329790 and JP-A No. 2005-311299, the thickness of the barrier film which covers the upper face of the aluminum film is thin and aluminum is a metal with a low melting point, so that it is necessary to deposit it at a low temperature and for a short time when a capacitive dielectric film is made using it. For instance, if a capacitive dielectric film is deposited at a temperature higher than the melting point of aluminum, cracks are created in the thin barrier film which covers the upper face of the aluminum film because of the effects of the stress due to thermal expansion of the aluminum and hillocks, so that a problem arises that the breakdown voltage of the capacitive dielectric film is decreased.

On the other hand, when it is discussed to make the film thickness of the capacitive dielectric film thinner in order to increase the capacitance of the MIM capaciter, a problem, such as an increase in the leakage current and a decrease in the breakdown voltage, etc., arises due to an instability factor of the film quality. Therefore, when the thickness of the capacitive dielectric film is made thinner, it is necessary to take measures to keep the film quality excellent, where the deposition temperature of the capacitive dielectric film is made higher and the deposition rate is made lower and the deposition time being made longer, etc.

However, performing the deposition of a capacitive dielectric film at a high temperature and for a long time creates problems where the breakdown voltage of the capacitive dielectric film is decreased by stress due to the thermal expansion of aluminum and to hillocks as described above. As a result, a MIM capacitor with high performance and high capacitance could not be achieved.

A technology described in JP-A No. 2002-43517 is not one which counters the above-mentioned problem during deposition of the capacitive dielectric film, and it is not one sufficient for achieving a MIM capacitor with high performance and high capacitance.

It is an objective of the present invention to provide a semiconductor device and a manufacturing method thereof, where improvement of the dielectric voltage is possible by making the deposition temperature of the capacitive dielectric film higher, where a decrease of the breakdown voltage of the capacitance insulator film due to cracks of a barrier film does not occur, and where a MIM capacitor with high performance and high capacitance is included.

In order to solve the aforementioned problems, in the present invention, the film thicknesses of the upper barrier film of the lower electrode of the capacitive element and the upper barrier film of the metallic interconnect layer formed in the same layer are made thicker than the upper barrier film of the other metallic interconnect.

Moreover, in this invention, the film thickness of the upper barrier film of the lower electrode of the capacitive element is made to be 110 nm or more, and, more preferably, 160 nm or more.

Without decreasing the dielectric voltage of the capacitive dielectric film due to cracks in the upper barrier film, the deposition temperature of the capacitive dielectric film can be made higher, resulting in a semiconductor device being achieved, which has a MIM capacitor with high performance and high capacitance where the dielectric voltage of the capacitive dielectric film is improved.

DETAILED DESCRIPTION OF THE PREFERRED EMBODIMENT

Figure 1:
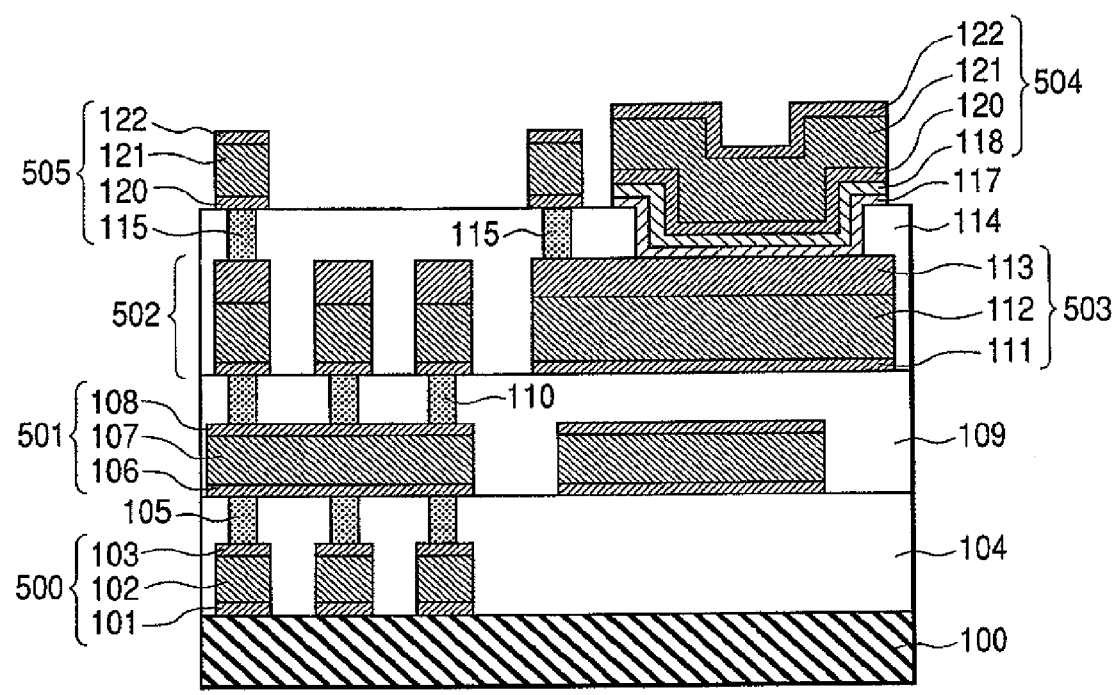
FIG. 1 is a schematic cross-sectional drawing illustrating a semiconductor device of the present invention.

Hereafter, embodiments of the present invention are described in detail referring to the drawings. FIG. 1 is a schematic cross-sectional drawing illustrating a semiconductor device of the present invention. Moreover, FIG. 2 to FIG. 9 are cross-sectional drawings illustrating a manufacturing method of a semiconductor device of the present invention. Hereinafter, the manufacturing process will be described step by step.

First of all, a 70 nm thick first lower barrier layer 101, a 500 nm thick first aluminum alloy film 102, an 85 nm thick first upper barrier film 103 are formed by a sputtering technique over a semiconductor substrate 100 where a plurality of semiconductor elements are formed, and a first metallic interconnect layer 500 where a plurality of aluminum interconnects are provided is formed by processing these films using a lithography technique and a dry-etching technique. The first lower barrier film 101 is formed of a stacked film where a 10 nm thick titanium film, a 50 nm thick titanium nitride film, and a 10 nm thick titanium film are stacked from the bottom, and the first upper barrier film 103 is formed of a stacked film where a 10 nm thick titanium film and a 75 nm thick titanium nitride film are stacked from the bottom.

Next, after depositing a 1900 nm thick silicon oxide film by using a plasma CVD technique, the upper face thereof is planarized by using a chemical mechanical polishing technique and a first interpoly dielectric film 104 is formed thereon. Next, a plurality of contact holes are formed where a part of the upper face of the first metallic interconnect layer 500 is exposed by processing the first interpoly dielectric film 104 using a lithography technique and a dry-etching technique, and a plurality of first conductive contact hole plugs 105 composed of a barrier film and a tungsten film are formed inside of these contact holes.

Figure 2:
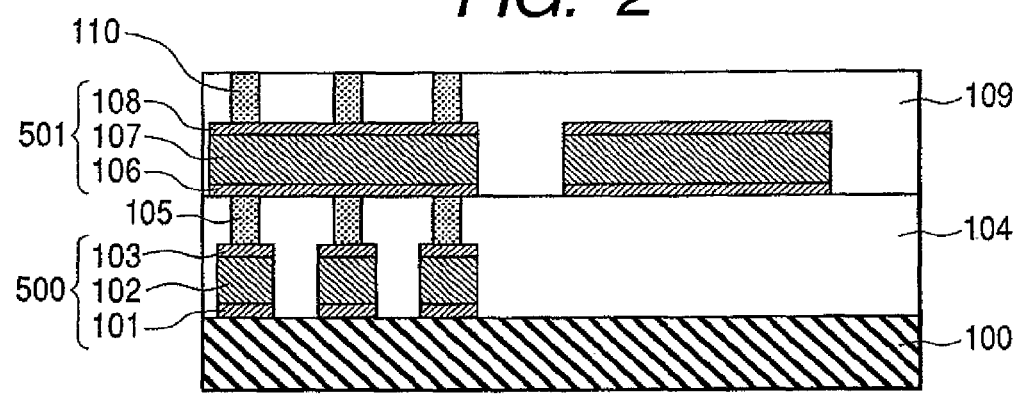
FIG. 2 is a schematic cross-sectional drawing illustrating a manufacturing process of a manufacturing method of a semiconductor device in the present invention.

Next, a second metallic interconnect layer 501 where a plurality of aluminum interconnects are provided, a second interpoly dielectric film 109, and a plurality of second conductive contact hole plugs 110 are formed, relatively, by using the same processes as the formation processes of the aforementioned first metallic interconnect layer 500, the first interpoly dielectric film 104, and the first conductive contact hole plugs 105. In this case, the first metallic interconnect layer 500 and the second metallic interconnect layer 501 are typical interconnect layers which are generally used for connecting a plurality of semiconductor elements, etc. formed over the semiconductor substrate 100. (FIG. 2). Similar to the first metallic interconnect layer 500, the second metallic interconnect layer 501 is formed of a second lower barrier layer 106, a second aluminum alloy layer 107 and a second upper barrier film 108.

Next, a 70 nm thick lower barrier film 111, a 500 nm thick third aluminum alloy film 112, a 160 nm thick third upper barrier film 113 are formed, in order, from the bottom by using a sputtering technique and, by processing these films using a lithography technique and a dry-etching technique, a third metallic interconnect 502 where a plurality of aluminum interconnects are provided and, a lower electrode 503 of a MIM capacitor are formed. The third lower barrier film 111 is formed of a stacked film where a 10 nm thick titanium film, a 50 nm thick titanium nitride film, and a 10 nm thick titanium film are stacked from the bottom, and the third upper barrier film 113 is formed of a stacked film where a 10 nm thick titanium film and a 150 nm thick titanium nitride film are stacked from the bottom.

Figure 3:
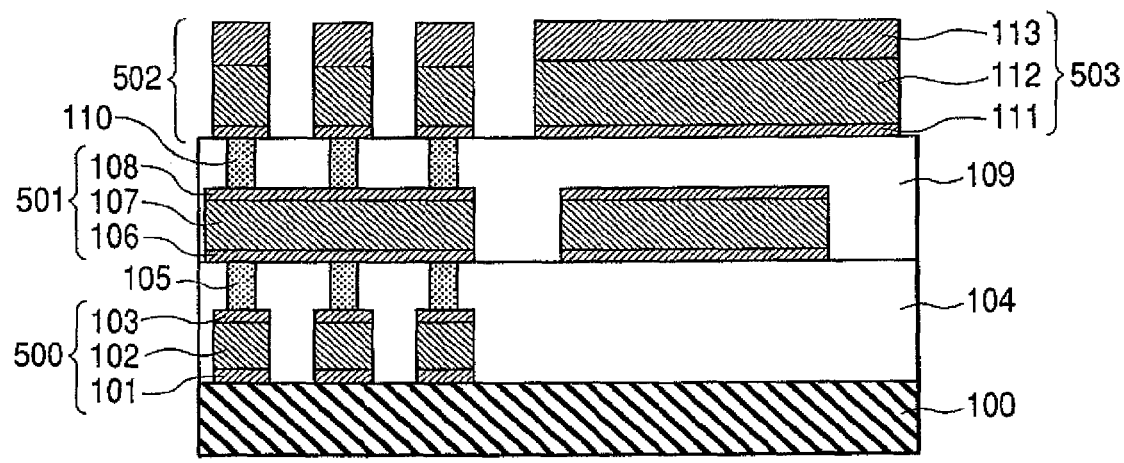
FIG. 3 is a schematic cross-sectional drawing illustrating a manufacturing process of a manufacturing method of a semiconductor device in the present invention.

A matter of particular importance in the present invention is that the lower electrode 503 of the MIM capacitor and the third upper barrier film of the third metallic interconnect layer formed in the same layer as 503 are made thicker than the film thicknesses of the first and second upper barrier films 103 and 108 of the first and second metallic interconnect layers 500 and 501 which are typical interconnects in general use. As a film thickness of the third upper barrier film, it is necessary to control it to be 110 nm or more as described later. More preferably, the film thickness of third upper barrier film is controlled to be 160 nm or more. (FIG. 3)

Figure 4:
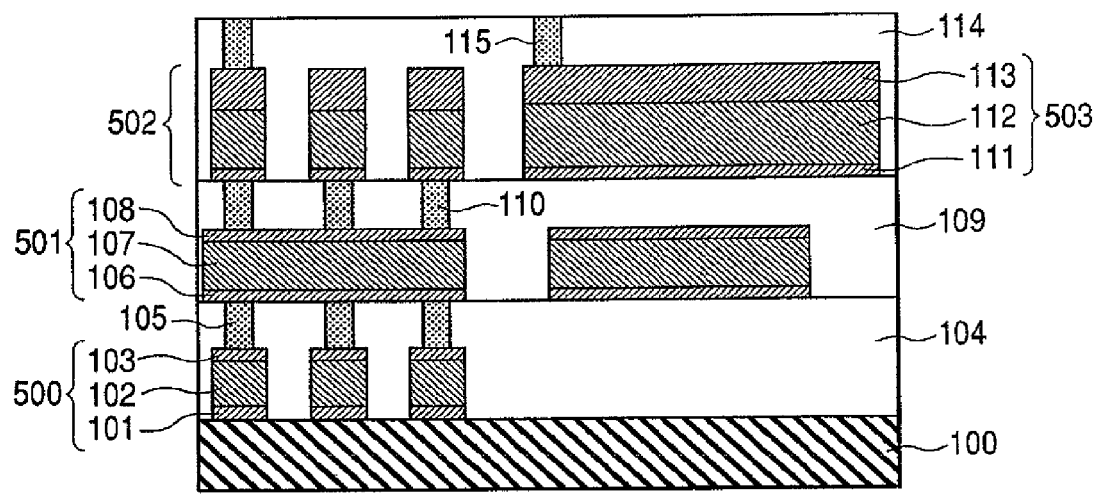
FIG. 4 is a schematic cross-sectional drawing illustrating a manufacturing process of a manufacturing method of a semiconductor device in the present invention.

Next, after a 1900 nm thick silicon oxide film is deposited by using a plasma CVD technique, the upper face thereof is planarized by using a chemical mechanical polishing technique and the third interpoly dielectric film 114 is formed thereon. Next, a plurality of contact holes are formed where a part of each upper face of the third metallic interconnect layer 502 and the lower electrode 503 of the MIM capacitor are exposed by processing the third interpoly dielectric film 114 using a lithography technique and a dry-etching technique, and a plurality of third conductive contact hole plugs 115 composed of a barrier film and a tungsten film are formed inside of these contact holes. (FIG. 4)

Figure 5:
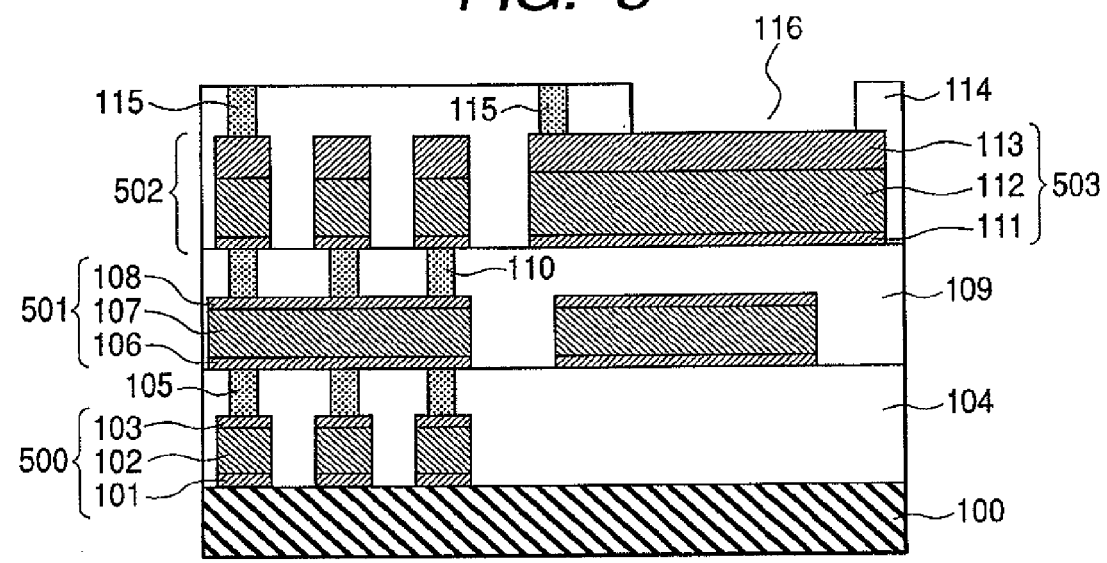
FIG. 5 is a schematic cross-sectional drawing illustrating a manufacturing process of a manufacturing method of a semiconductor device in the present invention.

Next, by partially removing the third interpoly dielectric film 114 over the lower electrode 503 of the MIM capacitor using a lithography technique and a dry-etching technique, the MIM capacitor formation area 116 is opened where a part of the upper face of the lower electrode 503 of the MIM capacitor is exposed. (FIG. 5)

Figure 6:
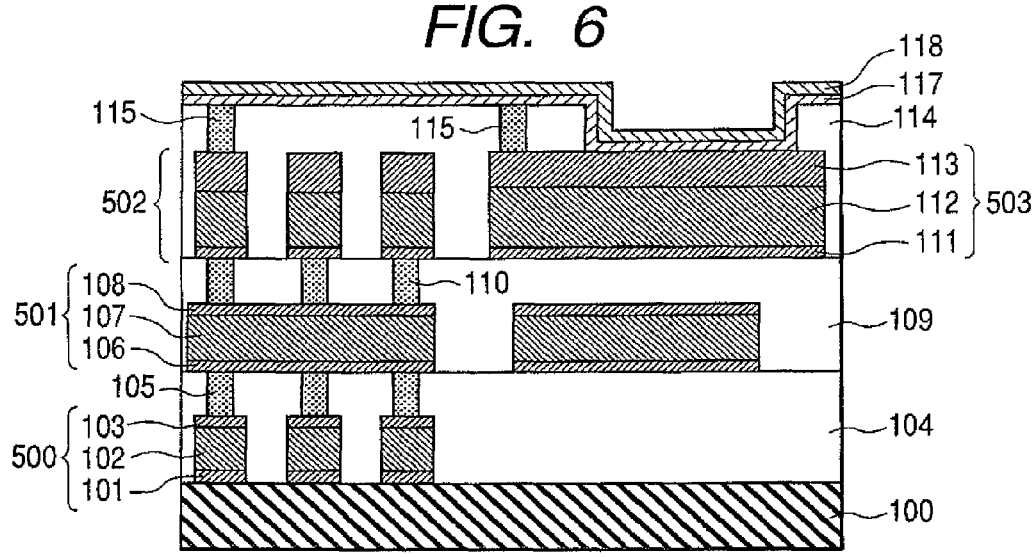
FIG. 6 is a schematic cross-sectional drawing illustrating a manufacturing process of a manufacturing method of a semiconductor device in the present invention.
Figure 7:
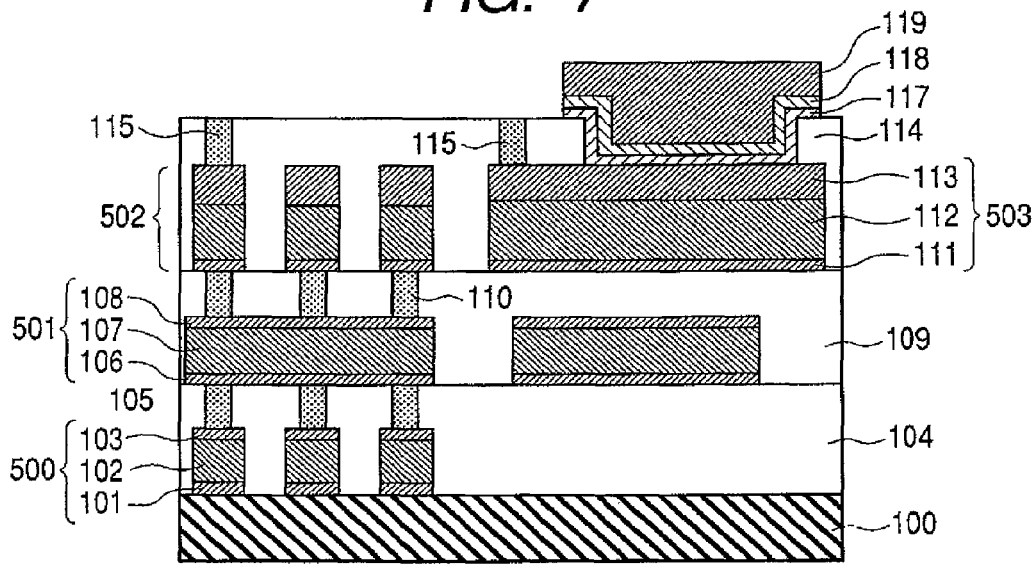
FIG. 7 is a schematic cross-sectional drawing illustrating a manufacturing process of a manufacturing method of a semiconductor device in the present invention.

Next, after the capacitive dielectric film 117 formed of a 20 nm thick silicon nitride film is deposited by an ALD (Atomic Laser deposition) technique, a protection film 118 formed of an 80 nm thick titanium nitride film for the capacitive dielectric film is deposited. This protection film 118 of the capacitive dielectric film becomes a part of the upper electrode of the MIM capacitor later. (FIG. 6)

Figure 8:
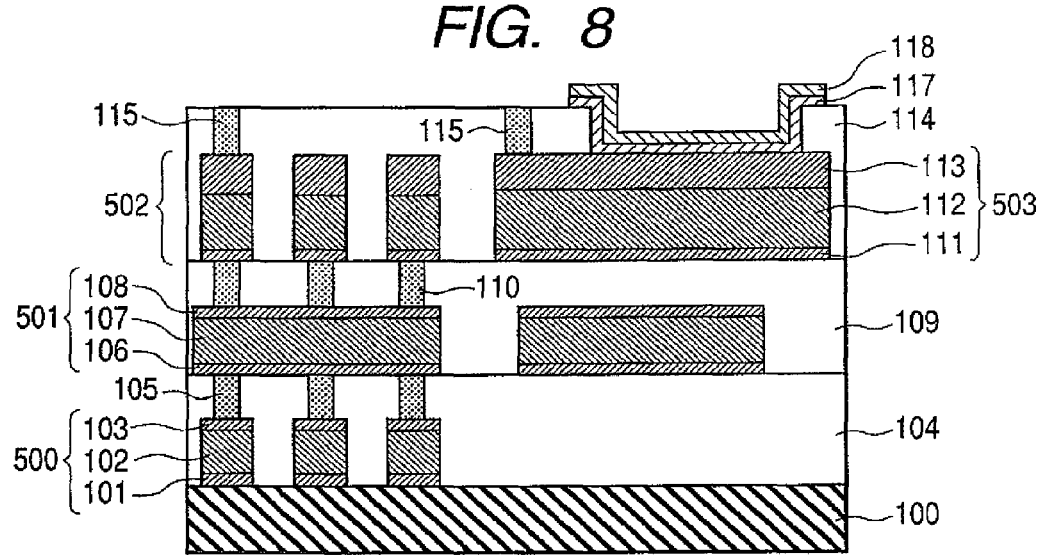
FIG. 8 is a schematic cross-sectional drawing illustrating a manufacturing process of a manufacturing method of a semiconductor device in the present invention.
Figure 9:
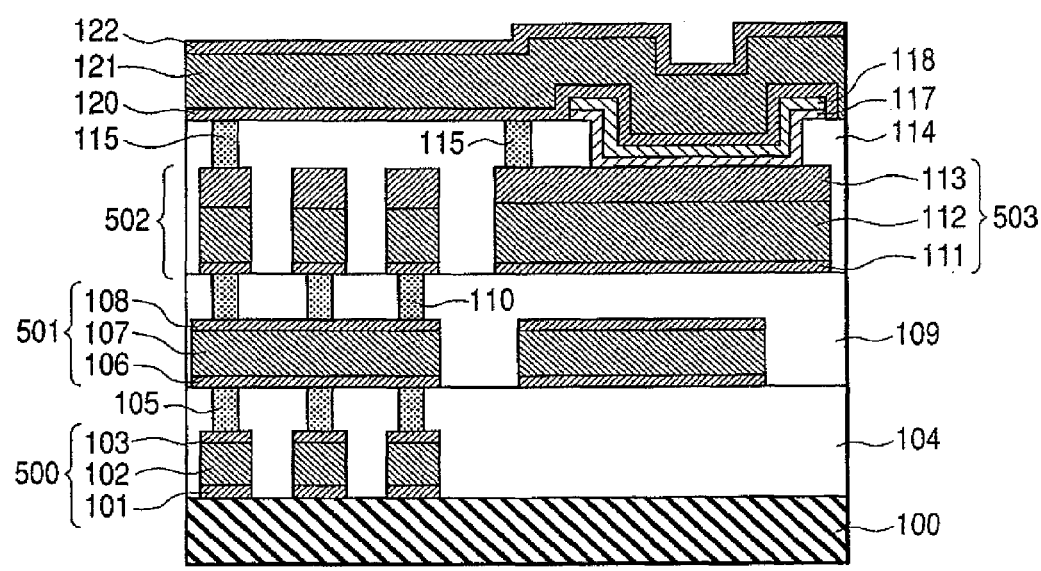
FIG. 9 is a schematic cross-sectional drawing illustrating a manufacturing process of a manufacturing method of a semiconductor device in the present invention.

Then, after a resist mask 119 is formed in the MIM capacitor formation area 116 by a lithography technique, the stacking film of the capacitive dielectric film 117 and the protection film 118 of the capacitive dielectric film are etched by a dry-etching technique. (FIG. 7) After that, the upper face of the third conductive contact hole plug 115 is exposed by removing the process resist mask 119. (FIG. 8)

Next, a 70 nm thick fourth lower barrier film 120, a 500 nm thick fourth aluminum alloy film 121, and an 85 nm thick fourth upper barrier film 122 are formed, in order, from the bottom by using a sputtering technique. The fourth lower barrier film 120 is a stacked film where a 10 nm thick titanium film, a 50 nm thick titanium nitride film, and a 10 nm thick titanium film are deposited from the bottom, and the fourth upper barrier film 122 is a stacked film where a 10 nm thick titanium film and a 75 nm thick titanium nitride film are deposited from the bottom, respectively. (FIG. 9) Afterwards, by processing the fourth lower barrier film 120, the fourth aluminum alloy film 121, and the fourth upper barrier film 122 using a lithography technique and a dry-etching technique, the fourth metallic interconnect layer 505, where a plurality of aluminum interconnects are provided, and the upper electrode 503 of the MIM capacitor are formed. (FIG. 1)

Figure 10:
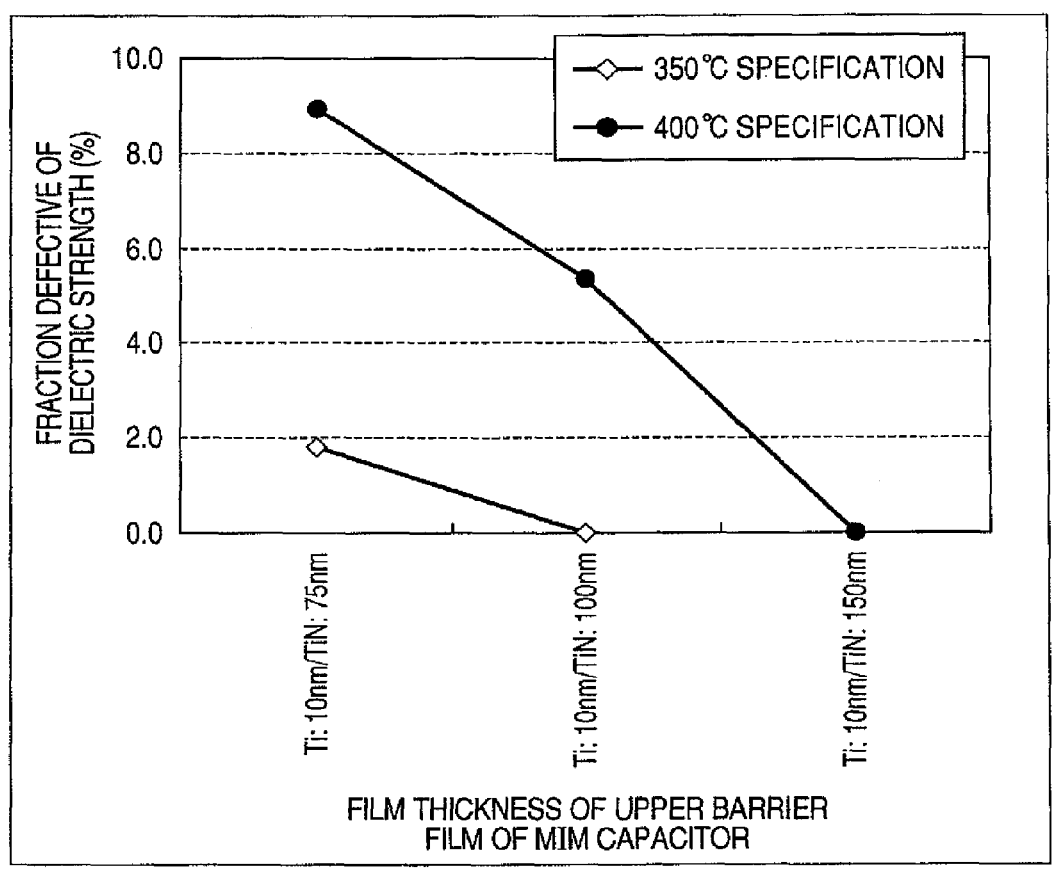
FIG. 10 is a diagram illustrating the dependence of the fraction defective of dielectric voltage of a MIM capaciter in the present invention on the film thickness of an upper barrier film of a lower electrode.

In a semiconductor having a MIM capacitor formed like this, the film thickness of the third upper barrier film 113 of the lower electrode 503 of the MIM capacitor is divided and the fraction defective of dielectric strength of the MIM capacitor is investigated. The results are shown in FIG. 10. Deposition of the capacitive dielectric film 117 herein was carried out at the deposition temperatures of 350° C. and 400° C. by using an ALD technique. In the 350° C. specification for deposition temperature, results were obtained in which the fraction defective of dielectric strength of the MIM capacitor becomes 0% by making the total film thickness of the third upper barrier film 113 to be 110 nm or more. Moreover, in the 400° C. specification for deposition temperature, results were obtained in which the fraction defective of dielectric strength of the MIM capacitor becomes 0% by making the total film thickness of the third upper barrier film 113 to be 160 nm or more. It is confirmed that a sample having poor dielectric strength has cracks in the third upper barrier film 113 due to the hillocks of the aluminum alloy film 112 of the lower electrode 503 of the MIM capacitor. On the other hand, in samples where dielectric strength failure does not occur, it is confirmed that no cracks were created in the third upper barrier film 113 due to hillocks of the aluminum alloy film 112 of the lower electrode 503 of the MIM capacitor, so that it can be said that the dielectric strength failure is caused by hillocks of the aluminum alloy film of the lower electrode of the MIM capacitor.

According to the aforementioned investigation results, it is understood that cracks in the upper barrier film due to hillocks of the aluminum alloy film can be prevented and the fraction defective of dielectric strength of the MIM capacitor can be decreased by making the film thicknesses of the upper barrier film of the lower electrode of the MIM capacitor and the upper barrier film of the aluminum interconnect layer formed in the same layer thicker than the film thickness of the upper barrier film of the other aluminum interconnect layer. Moreover, to be more specific, by controlling the film thickness of the upper barrier film of the lower electrode of the MIM capacitor to be 110 nm or more, more preferably, 160 nm or more, the deposition temperature of the capacitive dielectric film of the MIM capacitor can be increased to 350° C., and furthermore, 400° C., so that it is understood that an improvement in the dielectric voltage becomes possible due to increase in the deposition temperature of the capacitive dielectric film without decreasing the dielectric voltage of the capacitive dielectric film due to cracks in the upper barrier film.

In this embodiment, a 20 nm thick silicon nitride film formed by an ALD technique is used for the capacitance insulation film 117, however, the effectiveness of the present invention in the deposition technique, the film thickness, and the material are not intended to be limited to these. Since the capacitance density of the MIM capacitor increases inversely proportional to the film thickness of the capacitive dielectric film, a thinner film thickness is preferable for the film thickness of the capacitive dielectric film in order to increase the capacitance density and to improve the performance, and it may be changed according to the required value of the capacitance density. Moreover, as a material for the capacitive dielectric film, a film may be used, which includes an insulating material selected from the group of silicon oxide, silicon nitride, silicon oxide nitride, tantalum oxide, hafnium oxide, aluminum oxide, lanthanum oxide, zirconium oxide, PZT, STO, and BST as a main component, except for silicon nitride film. Moreover, as a deposition technique, a plasma CVD technique and a sputtering technique may be used, except for an ALD technique.

Moreover, in this embodiment, as the third lower barrier film 111 of the lower electrode of the MIM capacitor, a stacked film is used where a 10 nm thick titanium film, a 50 nm thick titanium nitride film, and a 10 nm thick titanium film are deposited, in order, from the bottom. However, the effectiveness of the present invention in the film thickness and the material are not intended to be limited to these. In many cases, the film thickness is determined from the viewpoint of the reliability such as the wiring resistance and the electro-migration of the interconnect, etc. which is required for the metallic interconnect layer formed in the same layer as the lower electrode of the MIM capacitor, and the total film thickness thereof is preferably in a range from about 20 nm to 100 nm in the area where a titanium film and a titanium nitride film are used. As a material for the lower barrier film, except for a titanium film and a titanium nitride film, a metal may be used, which includes a material selected from the group of tantalum, molybdenum, tungsten, and a nitride film thereof as a main component.

Moreover, in this embodiment, although a film thickness of 500 nm is used for the third aluminum alloy film of the lower electrode of the MIM capacitor, the effectiveness of this invention is not intended to be limited to this film thickness. It is determined from the requirement of the series resistance element, from the viewpoint of the wiring resistance which is required for the metallic interconnect layer formed in the same layer as the lower electrode of the MIM capacitor in the present invention, and the improvement of the high frequency property relative to the MIM capacitor. In this embodiment, a film thickness from 200 nm to 3000 nm is preferable.

Moreover, in this embodiment, although the upper barrier film of the lower electrode of the MIM capacitor uses a stacked film where a 10 nm thick titanium film and a 150 nm thick titanium nitride film are deposited, in order, from the bottom, it is not intended to be limited to this film thickness. The aforementioned film thickness may be used for the film thickness. As a material of the upper barrier film, except for a titanium film and a titanium nitride film, a metal may be used, which includes a material selected from the group of tantalum, molybdenum, tungsten, and a nitride film thereof as a main component, and there is no problem in obtaining the effects of a means for preventing cracks in the upper barrier film of the present invention.

Moreover, in this embodiment, although an interconnect layer mainly composed of an aluminum alloy film processed by using a dry-etching technique is used for the first metallic interconnect layer 500 and the second metallic interconnect layer 501 and, furthermore, a metallic film including tungsten as a main component is used for the first conductive contact hole plug 105 to connect them, an aluminum interconnect layer and copper interconnect layer using a Damascene process may be used for them as well.

What is claimed is:

1. A manufacturing method of a semiconductor device which includes a capacitive element comprising the steps of:

forming a first metallic film over a first interpoly dielectric film;

forming a first upper barrier film over said first metallic film;

forming a plurality of first metallic interconnects and a lower electrode of said capacitive element by processing a stacked film of said first metallic film and said first upper barrier film;

forming a second interpoly dielectric film which covers said plurality of first metallic interconnects and said lower electrode;

partially removing said second interpoly dielectric film and exposing a part of the upper face of said first upper barrier film of said lower electrode;

forming a capacitive dielectric film of said capacitive element over exposed said first barrier film of said lower electrode;

forming a second metallic film over said second interpoly dielectric film and said capacitive dielectric film;

forming a second upper barrier film over said second metallic film; and forming a plurality of second metallic interconnects and an upper electrode of said capacitive element by processing a stacked film of said second metallic film and said second upper barrier film, wherein the film thickness of said first upper barrier film is made thicker than the film thickness of said second upper barrier film by more than 25 nm.

2. The semiconductor device according to claim 1, wherein said first metallic film and said second metallic film are formed of films including aluminum as a main component.

3. The semiconductor device according to claim 2, wherein said first upper barrier film and said second upper barrier film are formed of a stacked film where a titanium film and a titanium nitride film are deposited.

4. The semiconductor device according to claim 3, wherein said first upper barrier film is formed to be a film thickness of 110 nm or more.

5. The semiconductor device according to claim 4, wherein said first upper barrier film is formed to be a film thickness of 160 nm or more.

* * * * *